United States Patent [19]

Nagumo et al.

[11] Patent Number: 5,128,709
[45] Date of Patent: Jul. 7, 1992

[54] IMAGE RECORDING METHOD

[75] Inventors: Akihiko Nagumo; Atushi Takagi, both of Kanagawa, Japan

[73] Assignee: Fuji Photo Film Co., Ltd., Kanagawwa, Japan

[21] Appl. No.: 145,960

[22] Filed: Jan. 20, 1988

[30] Foreign Application Priority Data

Jan. 20, 1987 [JP] Japan .................. 62-9153
Jan. 20, 1987 [JP] Japan .................. 62-9155
Sep. 14, 1987 [JP] Japan .................. 62-228595

[51] Int. Cl.5 .................. G03B 27/32; G03B 27/52
[52] U.S. Cl. .................. 355/27; 355/100; 355/106
[58] Field of Search .................. 355/27, 100, 106

[56] References Cited

U.S. PATENT DOCUMENTS 3,087,403  4/1963  Herrick .................. 355/100
3,259,048  7/1966  Smith .................. 355/27
4,021,110  5/1977  Pundsack .................. 355/27
4,095,886  6/1978  Koeleman et al. .................. 355/3 FU
4,194,826  3/1980  Lewis .................. 355/27
4,322,158  3/1982  Frias et al. .................. 355/27
4,448,516  5/1984  Arney et al. .................. 355/27
4,711,549 12/1987  Leonarous .................. 355/30

Primary Examiner—Monroe H. Hayes
Attorney, Agent, or Firm—Sughrue, Mion, Zinn, Macpeak & Seas

[57] ABSTRACT

A thermal developing unit in a photocopier in which a latent image is formed on a photo-sensitive material which is then pressed between an endless belt and a heating drum to be thermally developed. In order to maintain the correct temperature on the heating drum, the drum and belt are rotated during a warm-up period or whenever a long sheet of photo-sensitive material is being used. Alternatively, the endless belt can be made of a material having a low heat capacity.

3 Claims, 3 Drawing Sheets

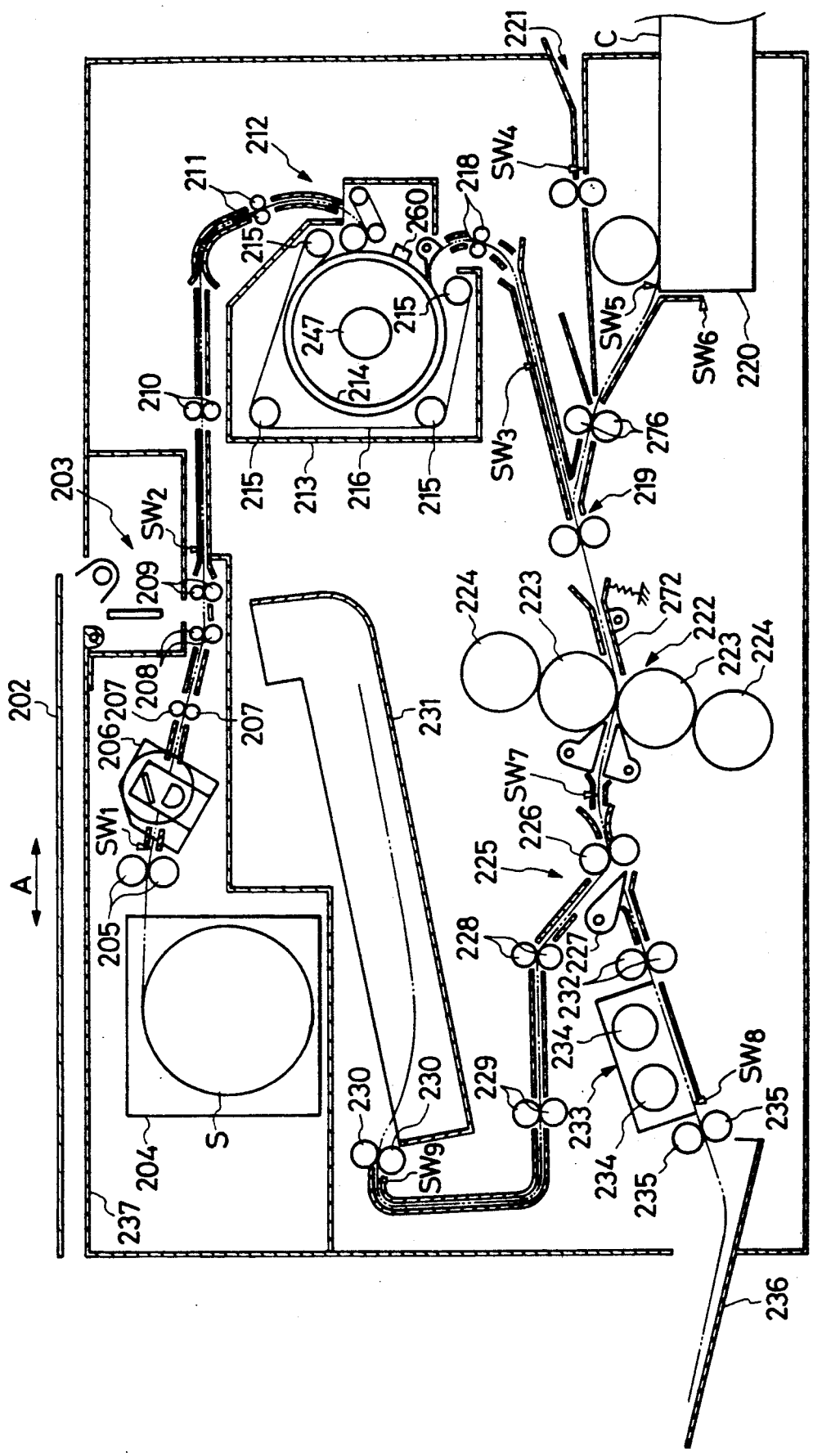

IMAGE RECORDING METHOD

BACKGROUND OF THE INVENTION

1. Field of the Invention.

This invention relates to an image recording method and apparatus in which a latent image is formed on a photo-sensitive material and is then thermally developed with the photo-sensitive material held between a heating drum and an endless belt.

2. Background Art

One example of an image recording material utilizing micro-capsules containing photo-sensitive compound has been disclosed, for instance, in Japanese Patent Application (OPI) No. 179836/1982 (the term "OPI" as used herein means an "unexamined published application"). The image recording material comprises a support and synthetic macromolecular resin wall capsules which contain vinyl compound, photo-polymerization initiator and coloring agent precursor which are carried on the support. This photo-sensitive material is optically exposed to form a latent image thereon so that the polymerizing compound is hardened according to the latent image thus formed. The latent image is developed under pressure.

In an image recording method using the image recording material, the image recording material is optically exposed to form a latent image thereon to harden the microcapsules according to the image. The microcapsules not so hardened are broken by application of pressure to the image recording material so that the coloring agent precursor is discharged to obtain a colored image. The method is advantageous in that an image of high picture quality can be readily obtained without wet processing. However, the image recording material is disadvantageous in that it is much lower in photo-sensitivity than an image recording material using silver halides.

A novel image recording material which has a higher photo-sensitivity than the above-described one and provides a high quality image by simple dry processing has been disclosed in Japanese Patent Application (OPI) No. 275742/1986 filed by the present Applicant.

An image recording method using that image recording material, namely, a photo-sensitive pressure sensitive thermal developing material, has been disclosed in Japanese Patent Application (OPI) No. 278849/1986 filed by the present Applicant. In this method, a latent image first is formed on the image recording material by optical exposure and then thermally developed so that the polymerizing compound in the region of the latent image is polymerized to produce a macromolecular compound to thereby harden the microcapsules. Thereafter, the image recording material is piled on an image receiving material having an image receiving layer onto which color image forming material can be transferred. The thus piled image recording material and image receiving material are pressed together so that at least some of the microcapsules in the region where not latent image is formed are broken so that the color image forming material is transferred onto the image receiving material to form the image of the latter.

An image recording apparatus for practicing the above-described image recording method has been disclosed by Japanese Patent Application No. 5189/1986 filed by the present Applicant. This method comprises the steps of forming a latent image on the photo-sensitive material by optical exposure, thermally developing the latent image thus formed, piling the photo-sensitive material on the image receiving material, and pressing together the thus piled photo-sensitive material and the image receiving material so that the image thus developed is transferred onto the image receiving material.

A thermal developing method and an apparatus for practicing the above methods have have been proposed in the art to perform the above-described thermal developing operation. In the method and apparatus, a heating drum having an interior heater and an endless belt laid on it are turned so that the latent image is thermally developed with the photo-sensitive material held between the heating drum and the needless belt. Thereafter, the photo-sensitive material is delivered to a sheet piling section.

The above-described method and apparatus are advantageous in that, since the heating drum and the endless belt hold the photo-sensitive material while turning at the same time, the photo-sensitive material is stably conveyed. However, they are disadvantageous in the following points.

While the image recording operation is suspended, i.e., while the driving of the heating drum and the endless belt is suspended, the heating drum is maintained at a predetermined temperature. Therefore, the part of the endless belt which is in contact with the surface of the hating drum is also held at the predetermined temperature, whereas the temperature of the remaining part of the endless belt which is not in contact with the surface of the heating drum gradually decreases.

When, under this condition, the heating drum and the endless belt are turned for thermally developing the latent image on the photo-sensitive material, the low temperature part of the endless belt comes to contact the surface of the heating drum to thereby cool it. As a result, the drum surface temperature is decreased about 6° C. form the desired temperature. If, under this condition, the thermal developing operation is carried out with the photo-sensitive material held between the heating drum and the endless belt, then since the developing temperature of the photo-sensitive material tolerates only a ±2° C. temperature variation, the photo-sensitive material is not uniformly heated. That is, the developing of the part of the photo-sensitive material which is not sufficiently heated is delayed, as a result of which the density of the image at that part is higher than originally it was intended to be. Thus, the resultant image is not uniform in density.

Another novel image recording material has been disclosed by Japanese Patent Application No. 117089/1985 filed by the present Applicant, to eliminate the above-described difficulty accompanying the conventional image recording material. The novel image recording material is high in photo-sensitivity and can provide an image of high picture quality by simple dry processing. The image recording material is formed by coating a support at least with a photo-sensitive silver halide, reducing agent, polymerizing compound and color image forming material, and among these materials, at least the polymerizing compound and the color image forming material are, in combination, sealed in microcapsules.

An image recording method using that image recording material has been disclosed in Japanese Patent Application No. 121284/1985 filed by the present Applicant. In this method, the image recording material is optically exposed to form a latent image thereon and is subjected to thermal developing so that, in the region of the latent image, the polymerizing compound is polymerized to produce macromolecular compound to harden the microcapsules. Under this condition, the image recording material thus processed is piled on an image receiving material having an image receiving layer. The image recording material and the image receiving material thus piled on one another are pressed together so that, in the region where no latent image is formed, at least some of the microcapsules are broken to transfer the color image forming material onto the image receiving material thereby to obtain the visible image thereon.

A further problem is that in the case where the image recording operation is not started yet and the heating drum and the endless belt are not yet turned, but the heating drum is heated by the heater so that the drum surface temperature is maintained constant, the temperature of the contact part of the endless belt with the heating drum rises more quickly than that of the non-contact part of the endless belt. That is, the endless belt is not uniformly heated. As the heating drum and the endless belt are turned, the low temperature part of the endless belt contacts the drum surface to cool down the drum. The endless belt is of heat-resisting rubber, and it is relatively large in thickness so as to be durable against rotation, as a result of which the endless belt has a large thermal capacity. Accordingly, the quantity of heat which the endless belt takes from the heating drum is so large that the drum surface temperature becomes lower by about 6° C. than the desired value. If, under this condition, the photo-sensitive material is subjected to thermal developing while being held between the heating drum and the endless belt, the photos-sensitive material is not uniformly heated because the tolerance and developing temperature of the photosensitive material is only which a range of ±2° C. As a result, the part of the photo-sensitive material where the quantity of heat for developing is inadequate is insufficiently developed. Therefore, the image developed on the photo-sensitive material is higher in density than that developed on a photo-sensitive material at the specified temperature. That is, the resultant image is not uniform in density.

A photo-sensitive material of the type in which a photo-sensitive material including silver halide is optically subjected to thermal developing while, in association with the thermal developing, the polymerizing compound is hardened, and thereafter a visible image is obtained through pressurization, has been disclosed by Japanese Patent Application No. 121284/1985 filed by the present Applicant. With this type of photo-sensitive material, after the thermal developing operation, color image forming material is transferred onto an image receiving material having an image receiving layer. The photo-sensitive material is formed by coating a support with at least a photo-sensitive silver halide, a reducing agent, a polymerizing compound and a color image forming material. Among these materials, at least the polymerizing compound and the color image forming material are, in combination, sealed in microcapsules.

When, in the thermal developing method and apparatus, the heating drum is heated by the heater under the condition that the heating drum and the endless belt are stopped during the warm-up period with the power switch turned on, the part of the endless belt which is in contact with the heating drum is quickly increased in temperature, while the temperature of the remaining part of the endless belt which is not in contact with the heating drum rises slowly. That is, the temperature of the endless belt is not uniformly increased. After the temperature of the heating drum has reached a predetermined value, the drum surface temperature is controlled to a certain value, whereas the part of the endless belt which is not in contact with the drum remains at a low temperature. When, under this condition, the heating drum and the endless belt are driven for developing the photo-sensitive material, the low temperature part of the endless belt contacts the drum surface to cool down the drum. For instance, the drum surface temperature becomes lower by about 6° C. than a predetermined value at which it should be maintained. As a result, the photo-sensitive material is not uniformly heated. Since the tolerance of the developing temperature of the photo-sensitive material is of the order of ±2° C., the resultant image is foggy in the part of the photo-sensitive material which has not been sufficiently heated for developing and its color density is higher than a predetermined value. That is, the image is not uniform in density.

SUMMARY OF THE INVENTION

Accordingly, an object of this invention is to eliminate the above-described difficulty accompanying the conventional image recording method.

More specifically, a first object of the invention is to provide an image recording method in which, when the image recording operation, after being suspended, is started again, the photo-sensitive material can be satisfactorily heated with the heating drum so that the developed image is high in picture quality.

A second specific object of the invention is to provide a thermal developing unit in which immediately when the thermal developing operation starts, a sufficient quantity of heat for developing is applied to the photo-sensitive material.

A third specific object of the invention is to provide a method of operating a thermal developing unit in which, when the thermal developing operation starts, the heating drum and the endless belt have been held at a predetermined developing temperature.

The foregoing first specific object of the invention has been achieved by an image recording method in which a latent image is formed on a photo-sensitive material and is then thermally developed with the photo-sensitive material held between a heating drum and an endless belt.

According to one aspect of the invention, the photo-sensitive material is shorter than the length of the contact region of the heating drum and the endless belt. Further, in an image recording operation other than that in which the photo-sensitive material is thermally developed, before the image recording operation the heating drum and the endless belt are operated. Then, the image recording operation is started after the temperature of the heating drum reaches a predetermined value.

According to another aspect of the invention, the heating drum and the endless belt are warmed up while being driven during the warm up period or during a period in which no image recording operation is carried out but the temperature of the thermal developing unit should be maintained at a predetermined value.

In the thermal developing unit, the thermal capacity of the endless belt is reduced so that the quantity of heat required for raising the temperature of the endless belt is decreased, whereby the decrease in temperature of the heating drum surface is maintained within tolerance. In the invention, a photo-sensitive material which is optically exposed to form a latent image thereon which is developed by pressurization may be used. Furthermore, the photo-sensitive material may be such that before the pressurization, the latent image formed thereon is preliminarily subjected to thermal developing or wet developing.

BRIEF DESCRIPTION OF THE DRAWINGS

FIG. 4 is a sectional view showing the arrangement of one example of an image recording apparatus utilizing a thermal developing unit according to two preferred embodiments of this invention.

DETAILED DESCRIPTION OF THE PREFERRED EMBODIMENTS

Figure 1:
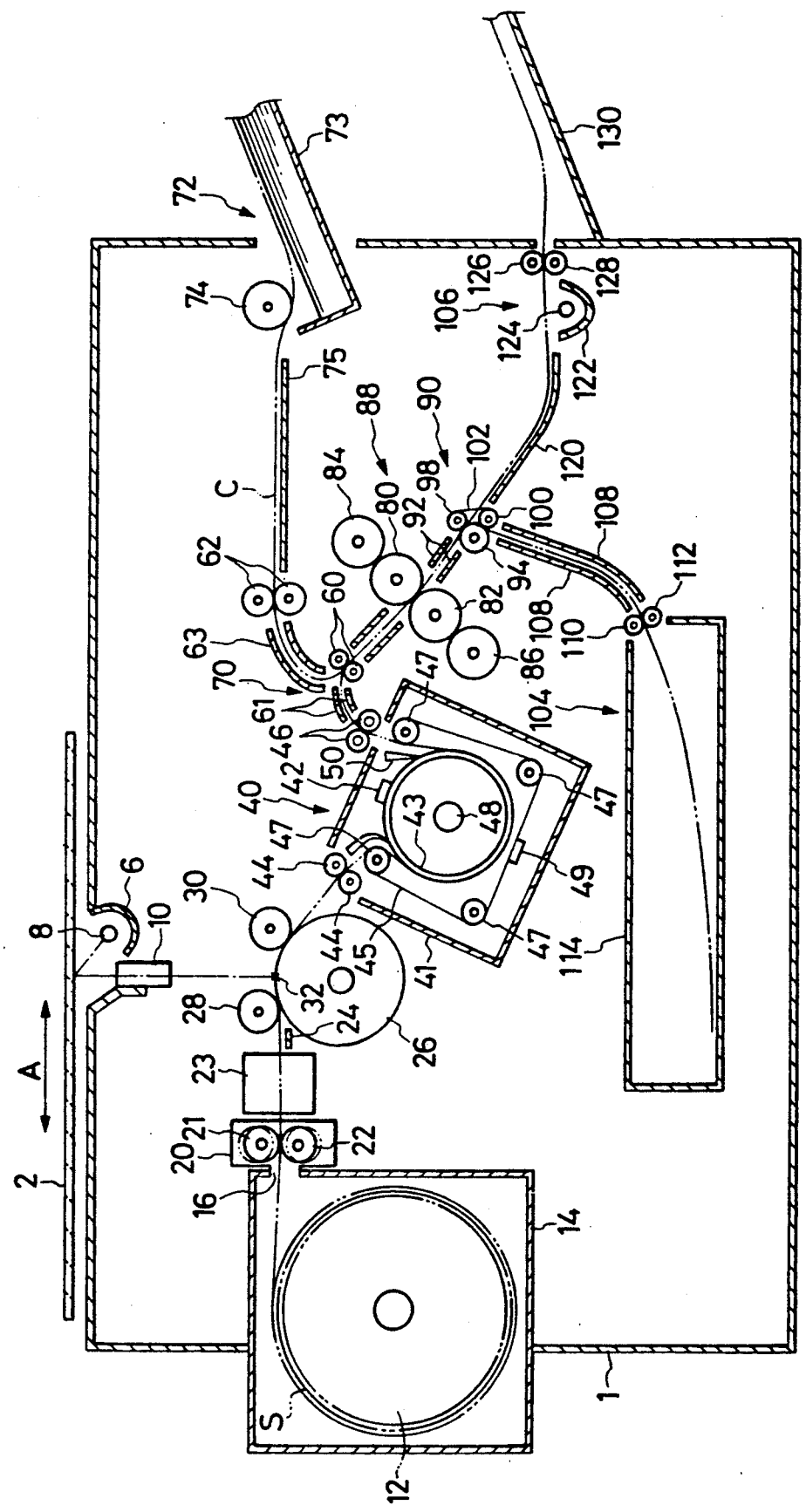
FIG. 1 is a sectional view showing the arrangement of an image recording apparatus for practicing an image recording method according to a first embodiment of this invention.

In the case where a photo-sensitive material is shorter than the length of the contact region of the heating drum and the endless belt, its thermal developing operation is not affected by the decrease in temperature of the heating drum by the endless belt when the image recording operation is started again. Therefore, in this case, the heating drum and the endless belt can be operated in association with the conveyance of the photo-sensitive material to the thermal developing section. On the other hand, in the case where a photo-sensitive material is equal to or longer than the length of the contact region of the heating drum and the endless belt, the heating drum and the endless belt are operated before the image recording operation. Therefore, the latent image on the photo-sensitive material is satisfactorily thermally developed because the decrease in temperature of the heating drum has been eliminated. No matter how many short photo-sensitive materials are handled, they can be developed at a uniform temperature. That is, any photo-sensitive material shorter than the length of the contact region of the heating drum and the endless belt can be satisfactorily thermally developed. In this case, it is unnecessary to preliminarily turn the heating drum and the endless belt.

In the invention, the photo-sensitive material which is optically exposed to form a latent image thereon which is developed by pressurization may be used.

Furthermore, the photo-sensitive material may be such that before the pressurization, the latent image formed thereon is preliminarily subjected to thermal developing or wet developing.

One example of the above-described photo-sensitive material has been disclosed by Japanese Patent Application (OPI) No. 179836/1982 filed by the present Applicant. The conventional photo-sensitive material is optically exposed to form a latent image thereon so that the polymerizing compound is hardened according to the latent image thus formed. Then, the latent image is developed under pressure. More specifically, the photo-sensitive material comprises a support and synthetic macromolecular resin wall capsules on the support which contain vinyl compound, photo-polymerization initiator and color agent precursor.

Japanese Patent Application (OPI) No. 278849/1986 filed by the present Applicant has disclosed a photo-sensitive material including silver halide which is optically exposed to form a latent image thereon. Then, the silver halide is subjected to thermal developing while, in association with the thermal developing, the polymerizing compound is hardened. Thereafter, a visible image is obtained through pressurization. With the photo-sensitive material disclosed by the aforementioned Japanese Patent Application (OPI) No. 278894/1986, after the thermal developing operation, color image forming material is transferred onto an image receiving material having an image receiving layer to thereby obtain a visible image thereon. The photo-sensitive material is formed by coating a support at least with photo-sensitive silver halide, reducing agent, polymerizing compound and color image forming material. Among these materials, at least the polymerizing compound and the color image forming material are, in combination, sealed in microcapsules.

A thermal diffusion transfer type photo-sensitive material disclosed by Japanese Patent Application No. 89376/1986 can be used in the invention.

One specific preferred embodiment of this invention will be described with reference to the case where a photo-sensitive material of the type that a thermal developing operation is carried out before a pressurizing operation is performed for transferring an image.

FIG. 1 is a sectional view showing an image recording apparatus for practicing the image recording method according to the invention.

In the image recording apparatus, an original supporting glass plate 2 is mounted on the upper surface of a housing 1 in such a manner that it can move reciprocally as indicated by the double-head arrow A. More specifically, the glass plate 2 is reciprocated in the directions of the arrow A with the surface of the original held inside (downwardly in FIG. 1). An illuminating lamp 8 with a reflecting mirror 6 for illuminating the original, and a SELFOC lens array 10 for forming the image of the original on a photo-sensitive material S passing a predetermined position are provided below the glass plate 2.

A photo-sensitive material magazine 14 holding a roll of photo-sensitive material 12 is detachably mounted on one side of the housing 1. A pair of photo-sensitive material feeding rollers 21 and 22 accommodated in a magazine-connected dark box 20 are arranged at the outlet 16 of the photo-sensitive material of the magazine 14. The rollers 21 and 22 feed the photo-sensitive material S over a predetermined length at a predetermined time or retract it when necessary.

When the front end of the photo-sensitive material S approaches the outlet 16 of the magazine, the photo-sensitive material feeding rollers 21 and 22 are moved away from each other as indicated by the phantom lines in FIG. 1 so that the photo-sensitive material can smoothly move on. A cutter unit 23 for cutting the photo-sensitive material and a guide board 24 are arranged forwardly of (in front of) the dark box 20. The term "forwardly of" as used herein is intended to mean downstream of the photo-sensitive material and/or an image receiving sheet (described later).

An exposed photo-sensitive material supporting roller 26 and two photo-sensitive material nip rollers 28 and 30 pressed against the supporting roller 26 are disposed in front of the guide board 24. The photo-sensitive material S guided by the guide board 24 is brought into close contact with the exposed photo-sensitive material supporting roller 26 by means of the two nip rollers 28 and 30 and is exposed at the position 32 between the rollers 28 and 30 by means of the SELFOC lens array 10 to form an image thereon.

A thermal developing unit 40 for thermally developing the photo-sensitive material S thus exposed is provided in front of the exposed photo-sensitive material supporting roller 26. The thermal developing unit 40 comprises a heat insulation housing 41, a hollow cylindrically shaped heating drum 43, four belt supporting rollers 47, and an endless belt 45 which is laid over the belt supporting rollers 47 and wound under tension around the heating drum 42 over about 270°. The photo-sensitive material S, while being conveyed by the belt 45 and the heating drum 43, is heated to about 140° C. by a halogen lamp 48 provided inside the heating drum 43. In this operation, temperature detectors 42 and 49 detect the surface temperatures of the heating drum 43 and the endless belt 45, thus controlling the operations of the heating drum 43, the belt 45 and the halogen lamp 48 so that the temperatures are stabilized.

The thermal developing unit 40 further comprises a pair of conveying rollers 44 for conveying the photo-sensitive material S to the developing unit 40, a separating pawl 50 for separating the photo-sensitive material S from the heating drum 43, and another pair of conveying rollers 46 for conveying the photo-sensitive material from the developing unit 40.

A sheet piling unit 70 piles an image receiving sheet on the photo-sensitive material S and is located downstream of the second pair of conveying rollers 46. The sheet piling unit 70 comprises a pair of abutting rollers 60, a guide member 61 for guiding the photo-sensitive material conveyed by the conveying roller pair 46 to the nip region of the rollers 60, and a guide member 63 which guides an image receiving sheet to the nip region of the rollers 60. The image receiving sheet is supplied from an image receiving sheet supplying unit 72 and is conveyed by a conveying roller pair 62.

The image receiving sheet supplying unit 72 includes an image receiving sheet cassette 73 accommodating a number of image receiving sheets C. The sheet cassette 73 is provided on the other side of the housing 1. A feeding roller 74 and a guide member 75 deliver the top of the image receiving sheets C stacked in the cassette 73 to the conveying roller pair 62.

An image transferring unit 88 is arranged downstream of the sheet piling unit 70. The image transferring unit 88 comprises a pair of pressurizing nip rollers 80 and 82 and a pair of back-up rollers 84 and 86 for making the pressure of the nip rollers 80 and 82 uniform in their axial direction. The nip rollers 80 and 82 are pressed against each other by a pressure of about 500 kg/cm².

A sheet separating unit 90 for separating the image receiving sheet C from the photo-sensitive material S is disposed downstream of the image transferring unit 88. The sheet separating unit 90 comprises a guide member 92, a conveying roller 94 and a separating belt 102 which is laid over guide rollers 98, 100 in such a manner that the belt 102 is pressed only against the photo-sensitive material S at two outer ends of the conveying roller 94.

Two paths extend from the sheet separating unit 90. A photo-sensitive material disposal section 104 is provided downstream of the lower one of the two paths. The disposal section 104 comprises a guide member 108, a pair of conveying rollers 110 and 112 and a disposal box 114. The photo-sensitive material S, which is delivered from the sheet separating unit 20 while being guided by the guide member 108, is sent into the disposal box 114 by means of the conveying rollers 110 and 112.

An image fixing unit 106 is provided downstream on the other path extending from the sheet separating unit 90. This unit 106 comprises a guide member 120, an ultraviolet lamp 124 with a reflector 122, and a pair of conveying rollers 126 and 128. In the image fixing unit 106, an ultraviolet beam irradiates the image receiving sheet C for about five (5) seconds after it has been delivered from the sheet separating unit 90 while being guided by the guide member 120. The result is that the image on it is fixed.

A take-out tray 130 for receiving the image receiving sheet C thus fixed is provided downstream of the image fixing unit 106 in such a manner that it protrudes from the housing 1.

Figure 2:
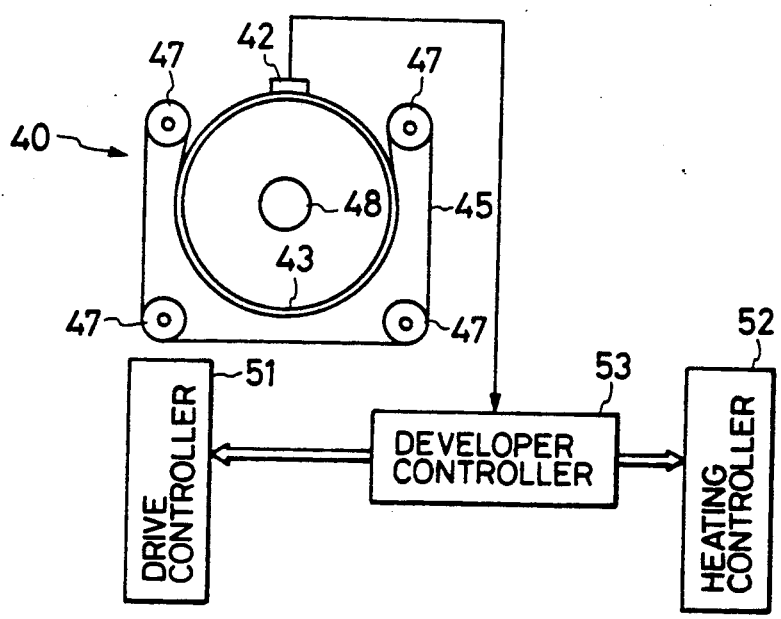
FIG. 2 is an explanatory diagram, partly as a block diagram, showing the arrangement of means for controlling the operation of a thermal developing unit in the apparatus of FIG. 1.

FIG. 2 is an explanatory diagram, partly as a block diagram, showing the arrangement of means for controlling the operation of the thermal developing unit 40. The temperature detector 42 detects the surface temperature of the heating drum 43. The surface temperature thus detected is utilized for controlling the operation of the thermal developing unit 40. The temperature detector is, for instance, a thermistor, which is held in contact with the drum at all times. The temperature detected by the temperature detector 42 is applied, a an input signal, to a developing unit control section 53, which controls the operations of a drive control section 51 and a heating control section 52. The developing unit control section 53 is, for instance, a CPU (central processing unit), and the drive control section 51 and the heating control section 52 are, for instance, simply switches.

Figure 3:
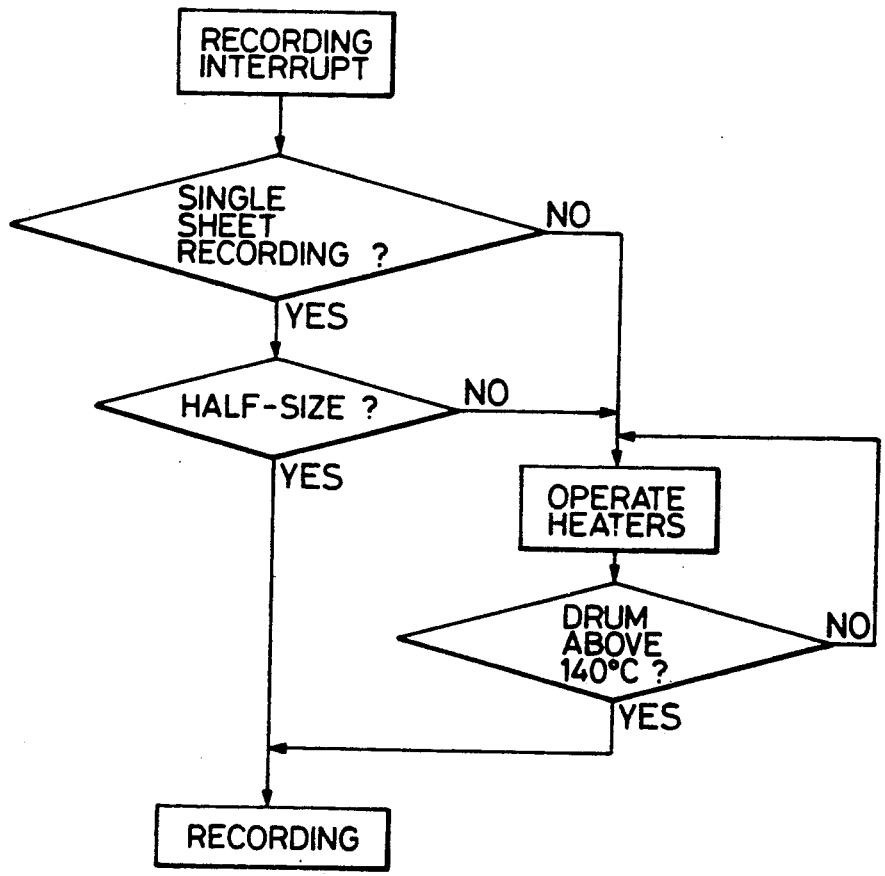
FIG. 3 is a flow chart for a description of the operation of the thermal developing unit of FIG. 1.

FIG. 3 is a flow chart for controlling the operation of the thermal developing unit 40, showing the operating steps from the preliminary operation for an image recording operation to the actual start of the image recording operation. When a recording start signal is inputted during the suspension of operation of the image recording apparatus, first it is determined whether an image recording operation is a single-sheet recording operation or a plural-sheet recording operation. In the case of the single-sheet recording operation, it is determined whether a half-size recording operation in which the width of the photo-sensitive material corresponds to the long side is performed or whether a full-size recording operation in which the width of the photo-sensitive material corresponds to the short side is to be carried out. In the case of a signal-sheet and half-size recording operation, the photo-sensitive material is supplied as in a conventional apparatus to perform the image recording operation as required.

In the case where the image recording operation is either not a single-sheet recording operation or is not a half-size recording operation, before the recording operation the thermal developing unit is operated to ensure a suitable temperature for the plural-sheet recording operation or the full-size recording operation. This will be described in more detail. When a plural-sheet recording operation signal or a full-size recording operation signal is inputted, before the recording operation is started, the heating drum 43, the halogen lamp 48 and the endless belt 45 are operated. When the temperature of the drum 43 detected by the temperature detector 42 is, for instance, 140° C. or higher, then the heating operation can be carried out satisfactorily, and, therefore, the recording operation can be started immediately. When the temperature of the heating drum 43 is lower than 140° C., the heating drum 43, the belt 45 and the halogen lamp 48 are further operated until it reaches 140° C.

The temperature of the heating drum, which is used to determined whether the recording operation can be started or not, is not limited to the above-described value. That is, this temperature should be determined according to the thermal capacities of the heating drum 43 and the endless belt 45, as well as the environmental conditions.

In the above-described embodiment, while the thermal developing unit 40 is being operated, the temperature detector 42 detects the temperature of the heating drum 43, thereby to determine whether or not the temperature of the heating drum 43 is acceptable. However, instead of this method, the following method may be employed. The temperature of the thermal developing unit 40 is detected before it is operated, and according to the temperature thus detected an operating time required for the heating drum's temperature to reach a predetermined value is calculated so that, before the recording operation is started, the thermal developing unit 40 is operated for a predetermined period of time.

Even in the case of the plural-sheet recording operation or the full-size recording operation, the thermal developing unit may be operated for a certain period of time before the image recording operation is started.

In the first embodiment of the invention, in the image recording operation other than that in which a photo-sensitive sheet shorter than the length of the contact region of the heating drum and the endless belt is subjected to thermal developing, before the image recording operation the heating drum and the endless belt are operated, Then, the image recording operation is started after the temperature of the heating drum reaches the predetermined value so that the image recording operation is controlled according to the number of photo-sensitive sheets to be used. Therefore, the photo-sensitive sheet will never be adversely affected by the decrease in temperature of the heating drum, and the heating developing operation is achieved satisfactorily at all times. Accordingly, no matter what size the photo-sensitive sheet has, the image recording operation can be satisfactorily achieved in a necessary and minimum period of time without being adversely affected by the environmental conditions.

Two other preferred embodiments of this invention will be described with reference to the same FIG. 4.

FIG. 4 is a sectional view showing one example of an image recording apparatus employed a thermal developing unit according to the invention.

As shown in FIG. 4, the apparatus comprises a housing 201 on the top surface of which a transparent original-supporting glass plate 202 is provided. An original to be recorded is placed on the glass plate 202. An optical exposure unit 203 is fixedly provided in the housing 201 below the glass plate 202. The glass plate 202 is reciprocated horizontally, as indicated by the arrow A, over the exposure unit 203 by drive means (not shown).

A magazine 204 accommodates a roll of photo-sensitive material S. The photo-sensitive material S is pulled out of the magazine 204 by means of a pair of feeding rollers 205. The magazine is mounted on or demounted from the housing 201 after an upper cover 237 is opened by turning it about its right end. The photo-sensitive material S pulled out of the magazine is conveyed to the exposure section by means of conveying rollers 207. 208 and 209, and it is cut to a predetermined length while being optically exposed, so that a photo-sensitive material S in the form of sheet on which a latent image is formed is obtained.

The photo-sensitive material S thus provided is conveyed to a thermal developing unit 212 by means of conveying rollers 210 and 211.

The thermal developing unit 212 comprises a heat insulation housing 213, a hollow cylinder-shaped heating drum 214, four belt supporting rollers 215, and an endless belt 216 laid over the belt supporting rollers 215 and wound on the heating drum 214 over about 240° under tension. The heating drum 214, the rollers 215, and the endless belt 216 are provided inside the housing 213. In the thermal developing unit 212, the photo-sensitive material S is conveyed while being held between the belt 216 and the drum 214 so that it is heated at about 140° C. by a halogen lamp 217 provided inside the heating drum 214. A temperature detector 260 is used to detect the surface temperature of the heating drum 214, to thereby control the halogen lamp 217 for temperature stabilization.

In the thermal developing unit 212, the photo-sensitive material S is subjected to thermal developing and is then conveyed out of the housing 213. The photo-sensitive material S thus processed is conveyed to a sheet piling section 219 by means of a conveying roller pair 218. In the sheet piling section 219, the photo-sensitive material S is piled on an image receiving sheet C which is supplied to the section 219 from an image receiving sheet cassette 220 or through a manual sheet supplying inlet 221. Then, the photo-sensitive material S and the image receiving sheet C are conveyed to a pressure-operated image transferring unit 222.

The image transferring unit 222 comprises a pair of pressurizing rollers 223 pressed against each other and two back-up rollers 224 which are pressed against the respective pressurizing rollers 223. A blade 272 for preventing the photo-sensitive material S and the image receiving sheet C from being creased is provided at the entrance of the image transferring unit 222 in such a manner that the edge of the blade 272 is in elastic contact with the pressurizing roller 223. A pressure of about 550 kg/cm$^2$ is applied to the photo-sensitive material S and the image receiving sheet C which have been piled on one another as described above so that the image formed on the photo-sensitive material S is transferred onto the image receiving sheet C. Thereupon, the photo-sensitive material S and the image receiving sheet C are forwarded to a sheet separating unit 225.

The sheet separating unit 225 comprises a pair of conveying rollers 226 and a sheet separating pawl 227. The pawl 227 swings downstream of the pair of conveying rollers 226 so that the pawl's end goes in between the photo-sensitive material S and the image receiving sheet C to separate them from each other.

The photo-sensitive material S separated from the image receiving sheet C is delivered into a disposal tray 231 by means of conveying rollers 228, 229 and 230. On the other hand, the image receiving sheet C, on which the image has been transferred, is separated from the photo-sensitive material S and is then conveyed to an image fixing unit 233 by means of a conveying roller pair 232. The image receiving sheet C is exposed to ultraviolet rays emitted from ultraviolet lamps 234 provided in the image fixing unit 233 so that the image thereon is fixed. The image receiving sheet C thus processed is delivered into a take-out tray 236 by means of a conveying roller pair 235.

In the above-described thermal developing unit 212, according to one aspect of the invention, the endless belt 216 is formed by molding heat resisting plastic resin such as polyimide or polyethylene terephthalate. The endless belt thus formed can be reduced in thickness to 0.5 mm or less while ensuring high durability against wear during rotation. That is, its thermal capacity can be made considerably small.

The endless belt functions as follows. During the suspension of the image recording operation, both the heating drum 214 and the endless belt 2316 are stopped. Immediately when the image recording operation is again started, the heating drum 214 and the endless belt 216 are turned. Since the thermal capacity of the endless belt 216 is small, the temperature of the part of the endless belt which is not in contact with the heating drum is quickly increased. In this case, the decrease in temperature of the heating drum is about 1° C. This is within the variation of ±2° C. which is the tolerance give to the developing temperature variation. Therefore, the heat required for the photo-sensitive material S to correctly color is uniformly given to the photo-sensitive material S. Therefore, the photo-sensitive material S is separated from the heating drum 214 by means of the sheet separating pawl 261 and is then conveyed out of the housing 213.

As was described above, the endless belt is reduced in thickness so that it is small in thermal capacity. Therefore, when the part of the endless belt which has been cooled down is brought into contact with the heating drum, the decrease in temperature of the heating drum is smaller. Accordingly, the quantity of heat necessary for raising the temperature of the endless belt to a predetermined value can be small according to the invention. Therefore, when the power switch is turned on, the warm-up period can be reduced.

Rather than rely on the thinness of the endless belt 216 to reduce thermal transients, according to another aspect of the invention, continuous operation will eliminate the transients.

In the above-described thermal developing unit 212, the heating rum 214 and the endless belt 216 are kept turned on at all times in this alternative approach, even when no image recording operation is carried out. That is, the other devices (units) re not in operation, only the heating drum 214 and the endless belt 216 are maintained turned on. This will present the occurrence of a temperature difference between the heating drum 214 and the endless belt 216. In this operation, the speed of the heating drum 214 and the endless belt 216 may be lower than that which is employed in the thermal developing operation.

The same effect can be obtained by another method in which, after the image recording operation is suspended, the heating drum 214 and the endless belt 216 are intermittently driven.

Furthermore, the same effect can be obtained by still another method. In the method, when the image recording operation is suspended, the heating drum 214 and the endless belt 216 are stopped similarly as in the remaining units in the image recording apparatus, and when the image recording operation is started again, the heating drum 214 and the needless belt 216 are driven immediately while the conveyance of the photo-sensitive material S is stopped. After the temperatures of the drum 214 and the belt 216 reach the desired value, the photo-sensitive material S is conveyed so as to be held between the drum 214 and the belt 216. That is, in the method, the operation of the thermal developing unit is sequentially controlled.

If, in the method, the speed of the drum 214 and the belt 216 is made higher during the warm-up period, then the photo-sensitive material's conveyance stop period can be decreased, and accordingly, the image recording period can be reduced.

In the case where, with the power switch of the image recording apparatus turned on, the temperature in the thermal developing unit is increased to the predetermined value, or in the case where the temperature in the thermal developing unit is set lower than the predetermined value for the economical use of power during the suspension of the image recording operation is raised again, similarly as in the above-described case, the heating drum 214 and the endless belt 216 can be warmed up while being driven so as to prevent the occurrence of the temperature difference between the drum 214 and the belt 216.

As a result of this warming up operation, the temperature in the thermal developing unit be maintained at 140±2° C. from the beginning of the thermal developing operation.

As was described above, before the image recording operation is started, the heating drum and the endless belt are warmed up while being driven so that the occurrence of a temperature difference between the heating drum and the endless belt is prevented. Accordingly, an image with high picture quality and free from irregular density can be formed on the photo-sensitive material which is subjected to thermal developing immediately after the image recording operation starts. Furthermore, when the power switch of the image recording apparatus is turned on, the temperature in the thermal developing unit can be stably increased.

What is claimed is:

1. A photocopying apparatus, comprising:
   means for forming a latent image on a photo-sensitive material; and
   means for thermally developing said photo-sensitive material, said thermally developing means including a heating drum and an endless belt pressing said photo-sensitive material against said heating drum, said endless belt having a thickness of no greater than 0.5 mm, said endless belt moving around said heating drum during operation of said photocopying apparatus, said endless belt having sufficiently low heat capacity to remove a sufficiently small amount of heat from said heating drum during movement around said heating drum to enable said heating drum to retain a temperature that is within 2° C. of a desired temperature for said heating drum.

2. A photocopying apparatus as recited in claim 1, wherein said endless belt comprises a plastic resin.

3. A method of operating a photocopier, comprising the steps of:
   forming a latent image on a photo-sensitive sheet;
   holding said photo-sensitive sheet having said latent image between a rotating heating drum and an endless belt, whereby said photo-sensitive sheet is thermally developed;
   measuring a temperature of said heating drum;

detecting a length of said sheet; and
if said sheet is longer than a length of a contact region between said heating drum and said endless belt, suspending said forming step and driving said heating drum and said endless belt until said measured temperature reaches a desired predetermined value.

* * * * *